(12) United States Patent
Liao et al.

(10) Patent No.: US 6,458,617 B1
(45) Date of Patent: Oct. 1, 2002

(54) MULTI-CHIP SEMICONDUCTOR PACKAGE STRUCTURE

(75) Inventors: Kuang-Ho Liao, Taipei (TW); Feng Lin, Taichung (TW); Yun-sheng Chen, Tainan Hsien (TW)

(73) Assignee: Vanguard International Semiconductor Corp., Hsinchu (TW)

( * ) Notice: Subject to any disclaimer, the term of this patent is extended or adjusted under 35 U.S.C. 154(b) by 0 days.

(21) Appl. No.: 09/788,703

(22) Filed: Feb. 20, 2001

(30) Foreign Application Priority Data

Dec. 14, 2000 (TW) ........................................ 89126688 A

(51) Int. Cl.$^7$ ............................................... H01L 21/00
(52) U.S. Cl. ........................... 438/51; 438/55; 438/108; 438/123
(58) Field of Search ............................. 438/51, 55, 64, 438/108, 111–113, 118, 123–126, 380, 381, 386, 15; 257/666, 686, 676–678, 723, 690, 691, 670

(56) References Cited

U.S. PATENT DOCUMENTS

| | | | | |
|---|---|---|---|---|
| 5,227,995 A | * | 7/1993 | Klink et al. | 257/666 |
| 5,701,031 A | * | 12/1997 | Oguchi et al. | 257/686 |
| 6,252,299 B1 | * | 6/2001 | Masuda et al. | 257/686 |
| 6,383,845 B2 | * | 5/2002 | Masuda et al. | 438/123 |

* cited by examiner

Primary Examiner—Chandra Chaudhari
Assistant Examiner—Yennhu Huynh
(74) Attorney, Agent, or Firm—J.C. Patents

(57) ABSTRACT

A multi-chip semiconductor package structure. The structure includes two chips and two lead frames. The leads on one of the lead frames have inner leads at one end and joint sections at the other end. The joint sections are connected with another lead frame. Both lead frames use a common set of external leads. The two chips and two lead frames are joined together forming a lead-on-chip structure with the two chips facing each other back-to-back. The assembly except the external leads is enclosed by packaging material.

19 Claims, 14 Drawing Sheets

MULTI-CHIP SEMICONDUCTOR PACKAGE STRUCTURE

CROSS-REFERENCE TO RELATED APPLICATION

This application claims the priority benefit of Taiwan application serial no. 89126688, filed Dec. 14, 2000.

BACKGROUND OF THE INVENTION

1. Field of Invention

The present invention relates to a multi-chip liquid semiconductor package structure and its method of manufacture. More particularly, the present invention relates to a duplicate chip, duplicate conductive wire package structure capable of shrinking overall package volume while increasing package reliability.

2. Description of Related Art

In this information explosion age, electronic products have enjoyed a close relationship with everybody in this society. Following the rapid progress in electronic technologies, electronic products have become lighter, smaller and more portable. In addition, most electronic products can provide highly personalized functions at an affordable price. Market forces are now pushing semiconductor manufacturers towards manufacturing packages having higher device density to volume ratio. One recent advance of package structure design is the introduction of multi-chip package.

FIG. 1 is a schematic cross-sectional diagram of a conventional lead-on-chip (LOC) chip-stack package structure. The LOC chip-stack package structure shown in FIG. 1 is disclosed in U.S. Pat. No. 5,701,031. The conventional lead-on-chip chip-stack package 100 in FIG. 1 has two chips, including a first chip 130 and a second chip 160, enclosed within a package material 102. The active surface 132 of the first chip 130 and the active surface 162 of the second chip 160 are facing each other. The package 100 also has two lead frames, a first lead frame 134 and a second lead frame 164. The first lead frame 134 includes a plurality of inner leads 136 and a plurality of outer leads 138. The second lead frame 164 has a plurality of inner leads 166 and a plurality of joint sections 168. The inner leads 136 and 166 are attached to the first chip 130 and the second chip 160 via adhesive tapes 140 and 170 respectively. Through wire bonding, the inner leads 136 and the inner leads 166 are electrically connected to the first chip 130 and the second chip 160 respectively by metallic wires 142 and 172. The packaging material 102 encloses the first chip 130, the second chip 160, the inner leads 136 and 166, the joint sections 168, the adhesive tapes 140 and 170, and the metallic wires 142 and 172. To form the package 100, the first chip 130 and the second chip 160 are attached to the first lead frame 134 and the second lead frame 164 using the adhesive tapes 140 and 170 respectively. Wire bonding is next carried out using a bonding machine. Ultimately, the inner leads 136 and the inner leads 166 are electrically connected to the first chip 130 and the second chip 160 respectively by metallic wires 142 and 172. The leads of the second lead frame 164 are next aligned with the leads in the first lead frame 134. Using a YAG laser beam, redundant portion of the joint sections 168 are cut away, and at the same time, the joint sections 168 and corresponding contact points on the first lead frame 134 are welded together. The structure is enclosed with plastic in a molding operation. Finally, dam bars (not shown) on the first lead frame 134 are removed following by the bending of external leads 138.

In the above package, the active surfaces of the two chips are facing each other and hence their respective metallic wires are on the same side. Under such circumstances, contact between a wire on one chip with a neighboring wire on another chip is highly probable and may lead to short-circuiting. A means to prevent short-circuiting is to increase chip separation. However, this will increase the overall package volume and packaging cost. Moreover, using YAG laser to joint the second lead frame 164 onto the first lead frame 134 is an expensive undertaking likely to increase production cost.

FIG. 2 is a schematic cross-sectional diagram of another conventional lead-on-chip (LOC) chip-stack package structure. The LOC chip-stack package structure shown in FIG. 1 is disclosed in U.S. Pat. No. 5,804,874. The lead-on-chip chip-stack package 200 in FIG. 2 also has two chips, including a first chip 230 and a second chip 260 embedded within a packaging material 202. The active surface 232 of the first chip 230 and the active surface 262 of the second chip 260 are both facing up. The package 200 has two lead frames, including a first lead frame 234 and a second lead frame 264. The first lead frame 234 has a plurality of inner leads 236 and a plurality of outer leads 238. The second lead frame 2 64 has a plurality of inner leads 266 and a plurality of joint sections 268. The inner leads 236 and the inner leads 266 are attached to the first chip 230 and the second chip 260 through adhesive tapes 240 and 270 respectively. The inner leads 236 and the inner leads 266 are electrically connected to the bonding pads 244 and 274 on the first chip 230 and the second chip 260 respectively by metallic wires 242 and 272. The packaging material 202 encloses the first chip 230, the second chip 260, the inner leads 236 and 266, the adhesive tapes 240, 270, 276 and 204, and the metallic wires 242 and 272. The purpose of putting additional adhesive tape 204 is to increase distance of separation between the lead 242 and the second chip 260 so that probability of electrical contact between the two is minimized. To form the package 200, the first chip 230 and the second chip 260 are attached to the first lead frame 234 and the second lead frame 264 using the adhesive tapes 240 and 270 respectively. Wire bonding is next carried out using a bonding machine. Ultimately, the inner leads 236 and the inner leads 266 are electrically connected to the bonding pads 244 and 274 on the first chip 230 and the second chip 260 respectively by metallic wires 242 and 272. The leads of the second lead frame 264 are next aligned with the leads of the first lead frame 234. The joint sections 268 of the second lead frame 264 are electrically connected to the first lead frame 234. The structure is enclosed with plastic in a molding operation. Finally, dam bars (not shown) on the first lead frame 234 are removed following by the bending of external leads 238.

In the above package structure, quite a few adhesive tapes are used. Since adhesive tapes have intrinsic tendency to absorb moisture at the processing stage, frequency of delamination of the package may intensify leading to a lower yield and reliability problem. Thus, the product may subsequently be damaged. Furthermore, short-circuiting between the lower metallic wires and the upper chip is prevented by putting up thick adhesive tapes. Ultimately, overall volume of the package will increase leading to an increase in production cost.

SUMMARY OF THE INVENTION

Accordingly, one object of the present invention is to provide a multi-chip semiconductor package structure capable of reducing circuit space and enclosing more chips within a given plastic mold, thereby lowering production cost.

A second object of the invention is to provide a multi-chip semiconductor package structure capable of preventing unwanted contact between a conductive wire attached to an upper chip and another conductive wire attached to a lower chip. Hence, device failure due to short-circuiting is avoided.

A third object of the invention is to provide a multi-chip semiconductor package structure capable of preventing unwanted contact between an upper chip and the conductive wire attached to a lower chip, thereby lowering production cost and increasing yield.

A fourth object of the invention is to provide a method of manufacturing a multi-chip semiconductor package capable of using fewer and simpler manufacturing steps so that production cost can be lowered.

A fifth object of the invention is to provide a multi-chip semiconductor package capable of using fewer adhesive tapes to reduce delamination. This improves the reliability and yield of the multi-chip semiconductor packaging product.

To achieve these and other advantages and in accordance with the purpose of the invention, as embodied and broadly described herein, the invention provides a multi-chip semiconductor package structure. The package mainly includes a first lead frame, a second lead frame, a first chip, a second chip and a packaging material. The first lead frame has a plurality of first leads. Each first lead has a first inner lead at one end and a first outer lead at the other end. The second lead frame has a plurality of second leads. Each second lead has a first inner lead at one end and a joint section at the other end. Each first lead corresponds to one of the second leads. The first chip has an active surface and a backside. The active surface of the chip has a plurality of bonding pads. The first chip is attached to the first lead frame through its active surface. The first chip is electrically connected with the first inner leads through its bonding pads. The second chip has an active surface and a backside. The active surface of the second chip has a plurality of bonding pads. The second chip is attached to the second lead frame through its active surface. The second chip is electrically connected with the second inner leads through its bonding pads. The backside of the first chip and the backside of the second chip are facing each other. The packaging material encloses the first chip, the second chip, the first inner leads and the second inner leads such that only a portion of the leads, the external leads, is exposed. In addition, the first leads and the joint sections are aligned and stacked together and they are electrically connected.

According to one embodiment of this invention, if the bonding pads on the first chip and the bonding pads on the second chip form a single row along a common axis Y, wires bonded to the first chip and wires bonded to the second chip has a mirror reflection relationship. In addition, both the first leads and the second leads have a bent just outside the first inner lead and the second inner lead.

This invention also provides a method of manufacturing a multi-chip semiconductor package. A first lead frame having a plurality of first leads is provided. Each first lead has a first inner lead at one end and a first outer lead at the other end. A second lead frame having a plurality of second leads is also provided. There is a dam bar between a pair of neighboring second leads. Each second lead has a second inner lead at one end and a joint section at the other end. Each first lead corresponds to one of the second leads. A first chip having an active surface and a backside is provided. The active surface of the first chip has a plurality of bonding pads. A second chip having an active surface and a backside is provided. The active surface of the second chip has a plurality of bonding pads as well. The active surface of the first chip and the active surface of the second chip are facing each other. The active surface of the first chip is attached to the first lead frame using adhesive tapes. Similarly, the active surface of the second chip is attached to the second lead frame using adhesive tapes. Wire bonding is carried out to connect electrically the bonding pads on the active surface of the first chip with the first inner leads. Similarly, wire bonding is carried out to connect electrically the bonding pads on the active surface of the second chip with the second inner leads. The first leads and the joint sections are aligned and then electrically connected. The entire assembly including the first chip, the second chip, the first inner leads, the second inner leads are placed inside the cavity inside a mold. This is followed by injecting a packaging material into the cavity so that the first chip, the second chip, the first inner leads and the second inner leads:are all enclosed. After molding, only external leads are exposed outside the package material.

According to one embodiment of this invention, each outer edges of the joint section further include a side bar. There is a cut at the junction between the joint section and the side bar for easy removal of the side bar in a subsequent step. If the bonding pads on the first chip and the bonding pads on the second chip form a single row along a common axis Y, wires bonded to the first chip and wires bonded to the second chip has a mirror reflection relationship., In addition, both the first leads and the second leads have a bent just outside the first inner lead and the second inner lead. The process of manufacturing the multi-chip semiconductor package may further include a cutting and a forming step. In the process, the dam bar is cut and the straight external leads are bent into an L-shaped.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
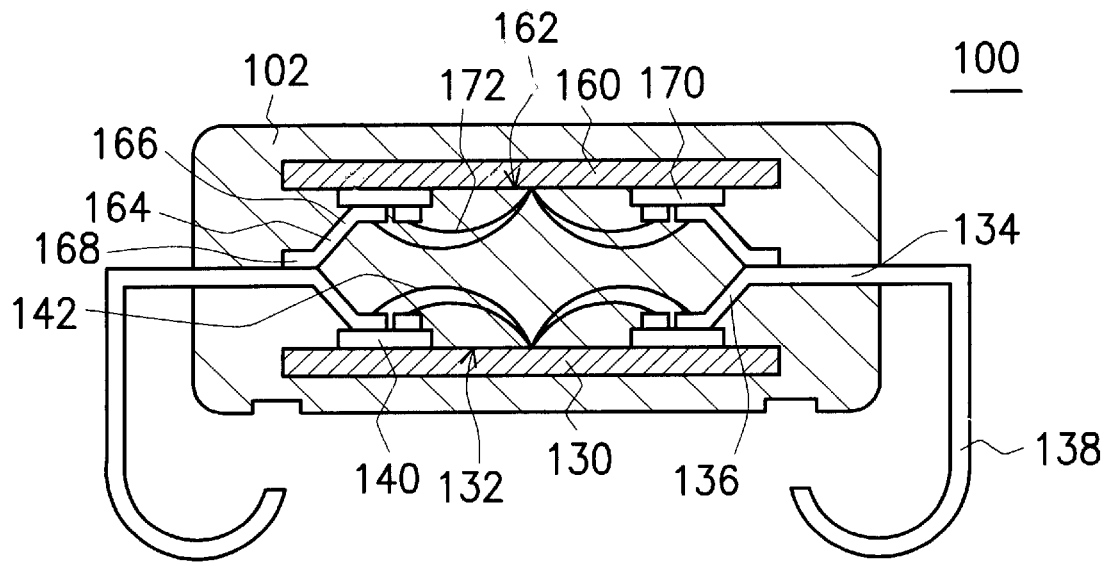
FIG. 1 is a schematic cross-sectional diagram of a conventional lead-on-chip (LOC) chip-stack package structure.
Figure 2:
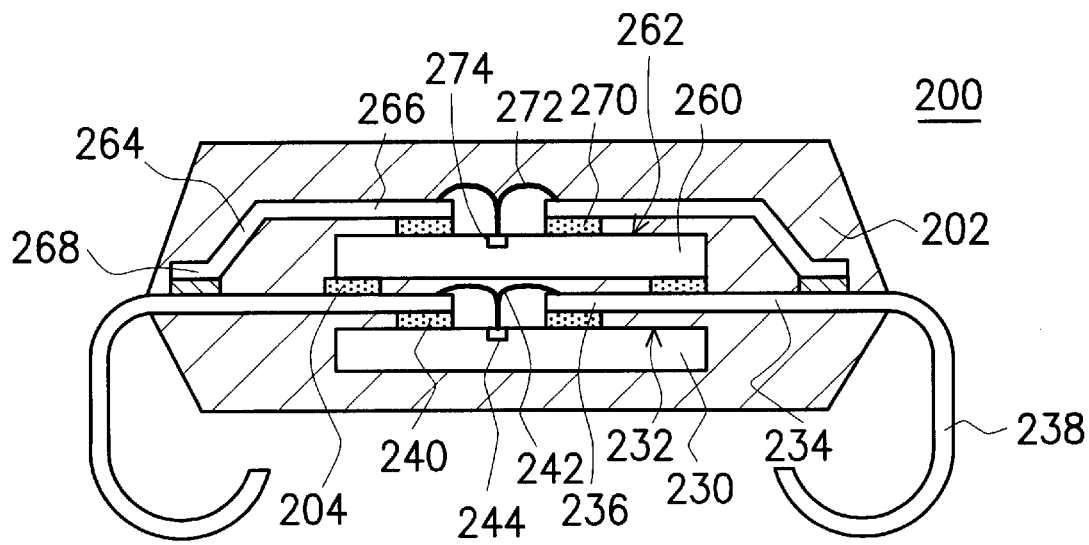
FIG. 2 is a schematic cross-sectional diagram of another conventional lead-on-chip (LOC) chip-stack package structure.

Reference will now be made in detail to the present preferred embodiments of the invention, examples of which are illustrated in the accompanying drawings. Wherever possible, the same reference numbers are used in the drawings and the description to refer to the same or like parts.

Figure 3:
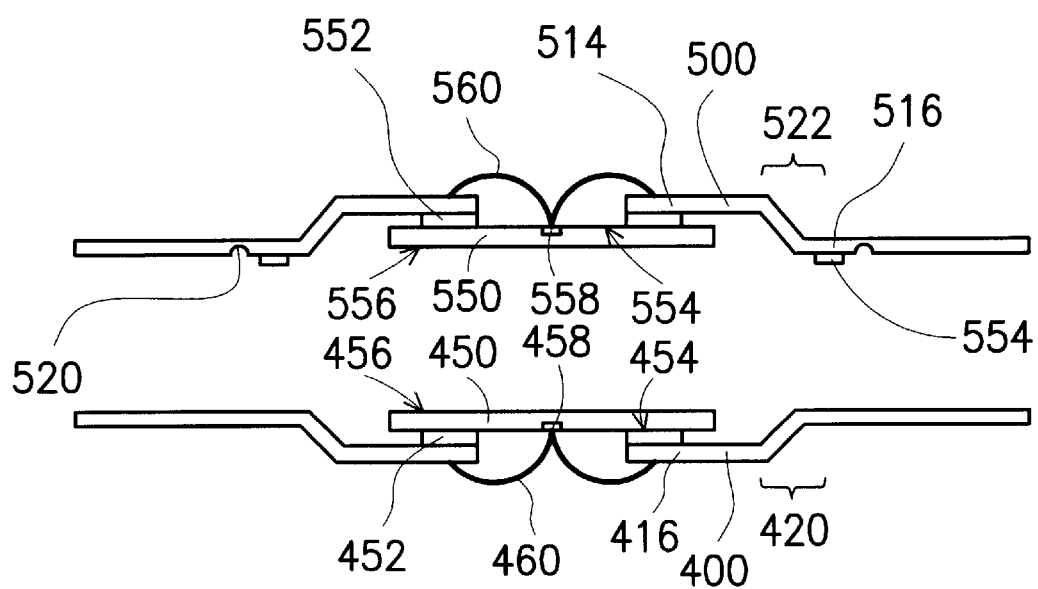
FIGS. 3 through 6 are schematic cross-sectional views showing a multi-chip semiconductor package structure according to a first preferred embodiment of this invention.
Figure 3A:
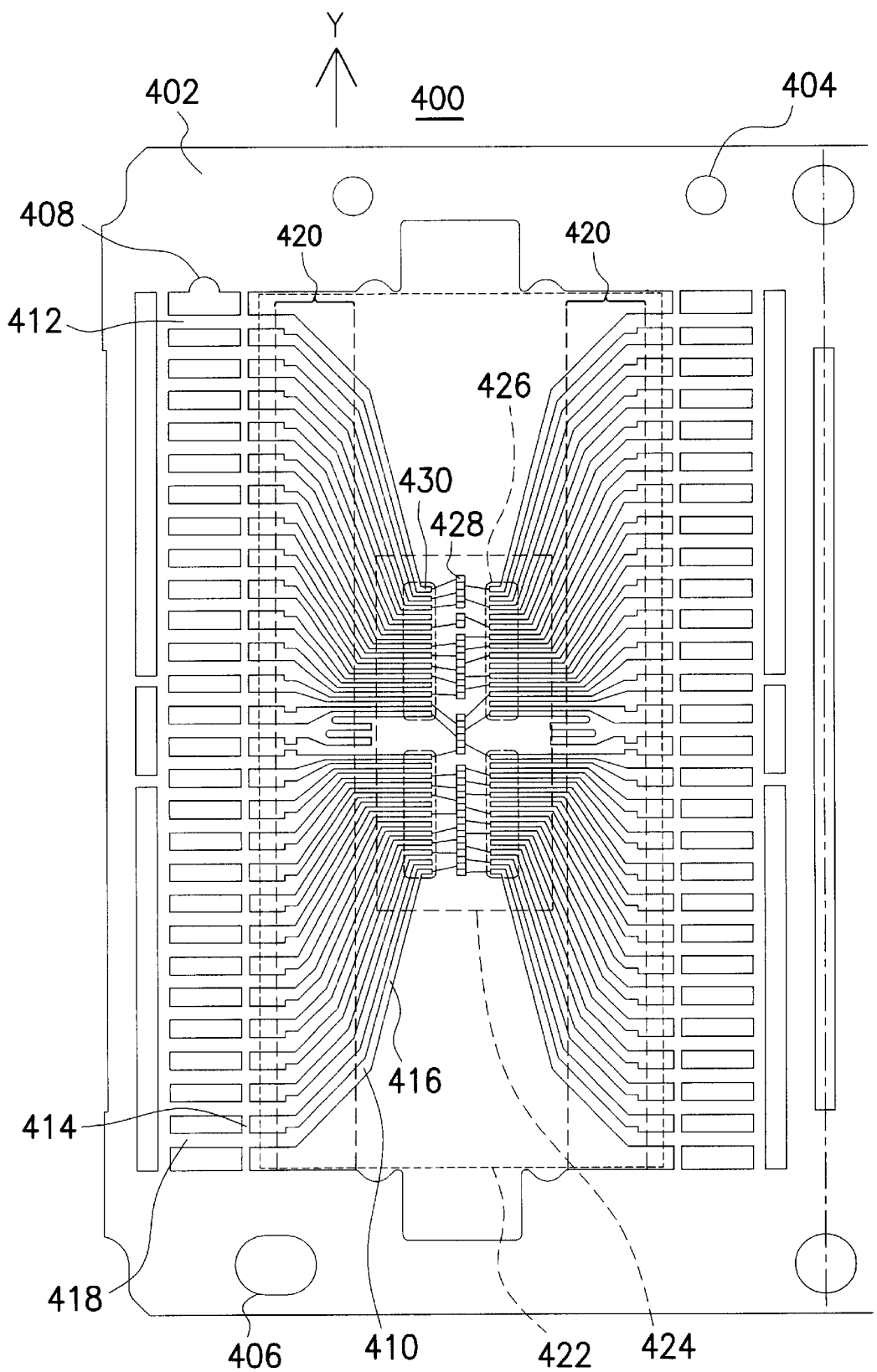
FIG. 3A is a bottom up view of the lead frame 400 shown in FIG. 3.

FIGS. 3 through 6 are schematic cross-sectional views showing a multi-chip semiconductor package structure according to a first preferred embodiment of this invention. FIG. 3A is a bottom up view of the lead frame 400 shown in FIG. 3, and FIG. 3B is a top down view of the lead frame 500 shown in FIG. 3.

First, lead frames 400 and 500 and chips 450 and 550 are provided. As shown in FIG. 3A, the lead frame 400 has two side rails that link up with a plurality of lead frame units. The side rails 402 has a plurality of guide holes 404 and a plurality of elongated holes 406 for guiding and driving various lead frame units along during production. On the inner side of one of the side rails 402, there is elongated hole 408 (pin1-index) indicating the position of the first pin 412 lead amongst a plurality of leads 410. Each lead 410 is positioned between neighboring dam bars 414. Each lead 410 has an inner lead 416 at one end for supporting the chip 450 and an outer lead 418 at the other end. Each lead 410 has a bent region 420 outside the edge of the inner leads 416. In FIG. 3A, the region enclosed by the dash lines 422 is the area subsequently sealed by packaging material. The region enclosed by dash line 424 is the area where the chip 450 occupies. The region enclosed by dash line 426 indicates the location where adhesive tapes 452 are laid. As shown in FIG. 3B, the lead frame 500 includes two side rails 502 that link up with a plurality of lead frame units. The side rails 502 has a plurality of guide holes 504 and a plurality of elongated holes 506 for guiding and driving various lead frame units along during production. On the inner side of one of the side rails 502, there is elongated hole 508 (pin1-index) indicating the position of the first pin 512 lead amongst a plurality of leads 510. Each lead 410 has an inner lead 514 at one end for supporting the chip 550 and a joint section 516 at the other end. The joint section 516 joins with a side bar 518. There is an indention 520 between the joint section 516 and the side bar 518. The indention 520 is formed by half etching or by half cutting in a punching machine. In addition, each lead 510 has a bent region 522 outside the edge of the inner leads 514. In FIG. 3B, the region enclosed by the dash lines 524 is the area subsequently sealed by packaging material. The region enclosed by dash line 526 is the area where the chip 550 occupies. The region enclosed by dash line 528 indicates the location where adhesive tapes 552 are laid. Using the lead frame of a DRAM as an example, the numbering of the leads 410 and the leads 510 has a mirror reflection relationship. In other words, if Y is taken as a base line for mirror reflection, the first lead 412 of the lead frame 400 is at the left upper corner position while the first lead 512 of the lead frame 500 is at the upper right corner position.

Figure 3B:
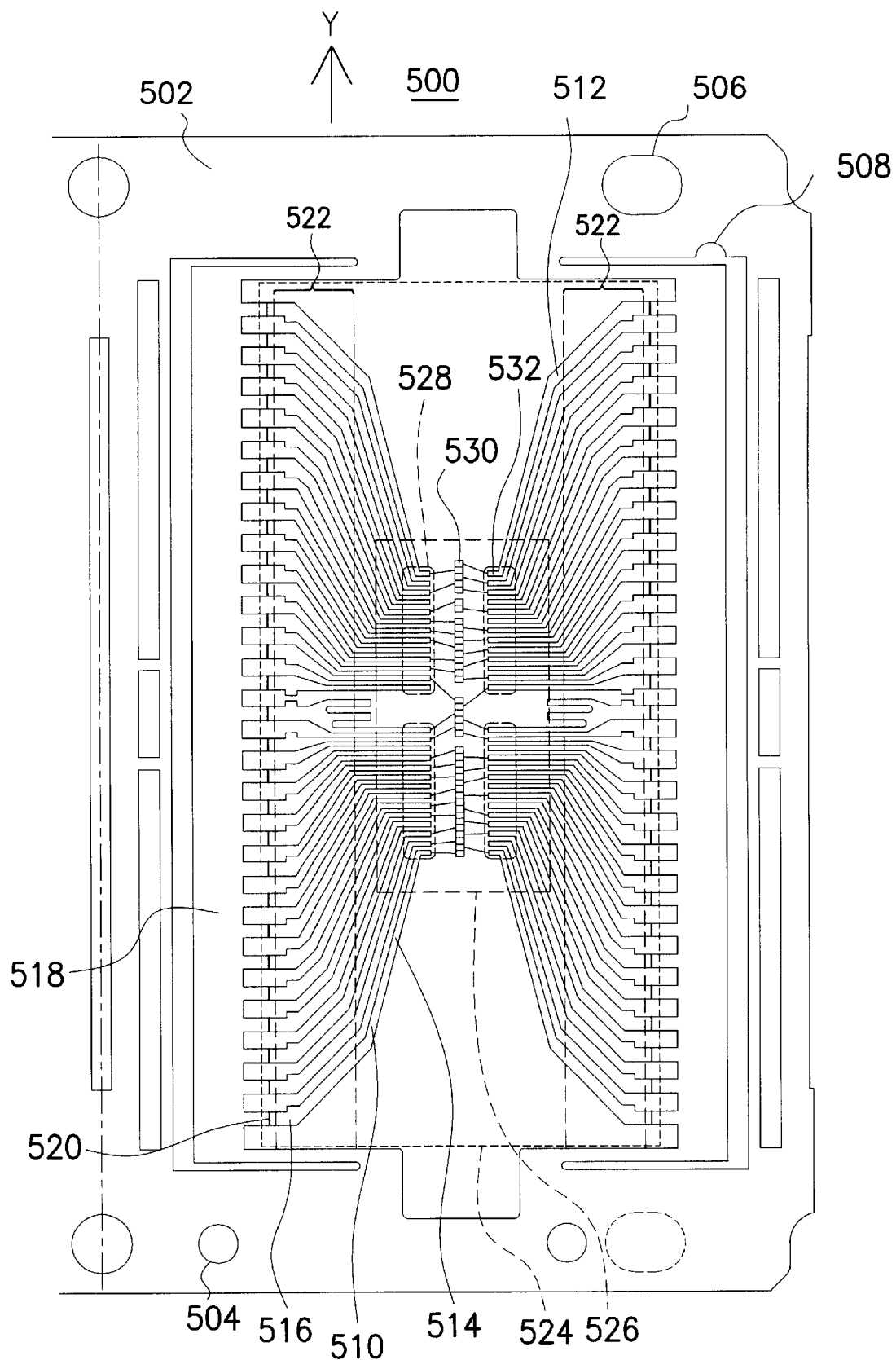
FIG. 3B is a top down view of the lead frame 500 shown in FIG. 3.

As shown in FIGS. 3, 3A and 3B, an indention 520 is formed near the outer edges of the joint section 516 of the lead frame 500 by half etching or by cutting with a punching machine. Using a printing method, a layer of conductive adhesive 522 such as solder paste is applied to the joint sections 516 of the lead frame 500. The two sides of the lead frames 400 and 500 are bent towards the chips 450 and 550 respectively forming bent regions 420 and 522 that equalize the flow packing material and unwanted warping in the final molding phase. The active surfaces 454 and 554 of the chips 450 and 550 are attached by adhesive tapes 452 and 552 to the lead frames 400 and 500 respectively. The backside 456 of the chip 450 and the backside 556 of the chip 550 are facing each other. In the subsequent step, a wire bonding operation is carried out using a wire-bonding machine. The bonding pads 458 and 558 on the active surfaces 454 and 554 of the chips 450 and 550 are electrically connected to the inner leads 416 and 514 respectively through conductive wires 460 and 560. Using DRAM as an example, the bonding pads 458 and 558 of the chips 450 and 550 form a single row right in the middle. Hence, the wire bonding on the lead frame 400 and the wire bonding on the chip 450 form a mirror reflection relationship. In other words, if the common axis of the bonding pads 458 and 558 is defined to be the Y axis, the Y axis can serves as a base line for performing mirror reflection. For example, if a conductive wire rise from the first bonding pad 428 on the active surface 454 of the chip 450 to the tip 430 of the first lead 412 on the left of the lead frame 400, then a similar piece of conductive wire will rise from the first bonding pad 530 on the active surface 554 of the chip 550 to the tip 532 of the first lead 512 on the right of the lead frame 500.

Figure 4:
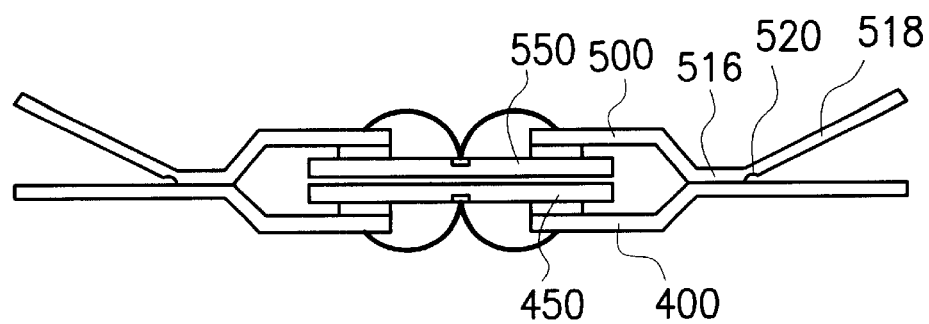

As shown in FIGS. 4, 3A and 3B, lead frames 400 and 500 together with their chips 450 and 550 are aligned and stacked. In other words, each lead 510 of the lead frame 500 aligns with a corresponding lead 410 of the lead frame 400. Through a welding or a gluing operation, the joint sections 516 of the lead frame 500 are electrically connected with the leads 410 of the lead frame 400. The side bar 518 outside the indentation 520 of the lead frame 500 is removed.

Figure 5:
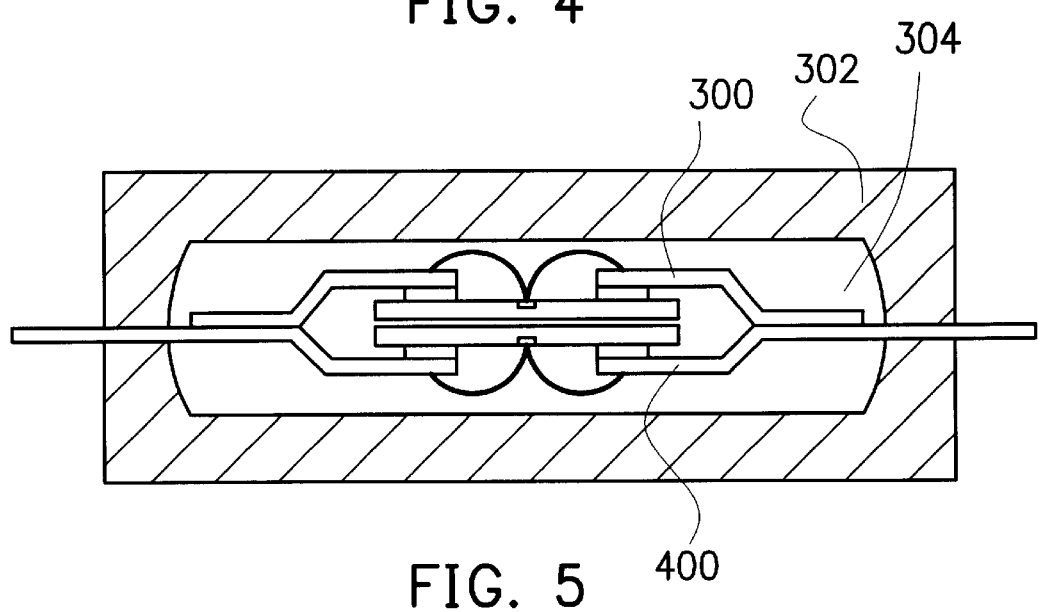

As shown in FIGS. 5, 3A and 3B, the welded or glued assembly 300 is placed inside the cavity 304 of a mold 302. The mold 302 grasps the lead frame 400 around the darn bar 414. Packaging material 306 is injected into the cavity 304 followed by cooling and mold ejection.

Figure 6:
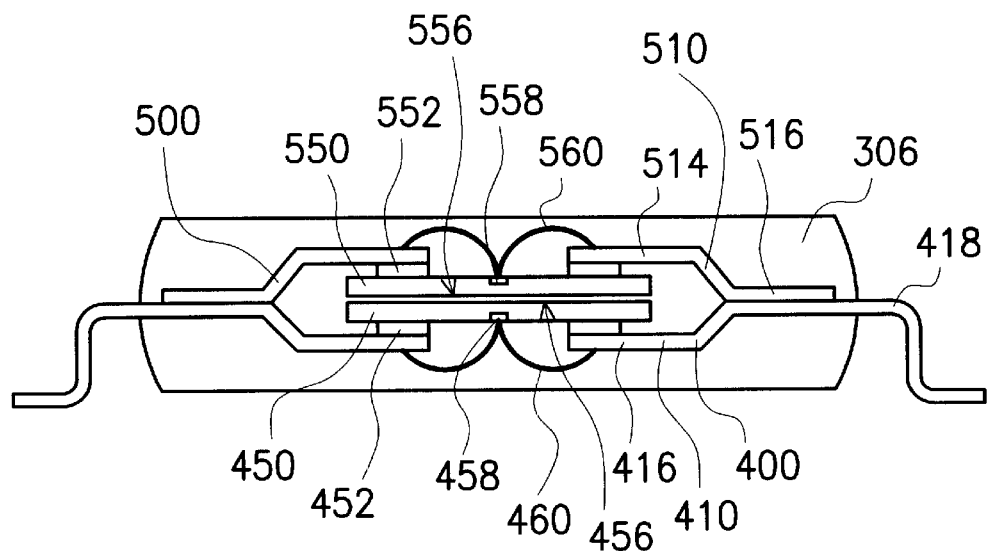

As shown in FIGS. 6, 3A and 3B, the packaging material 306 encloses the chips 450 and 550, the inner leads 416 and 514, the conductive lines 460 and 560, the bonding pads 458 and 558, and the adhesive tapes 452 and 552. Only the external leads 418 are exposed outside the package body. In the subsequent step, the dam bar 414 is cut away and the external leads 418 is bent into an L-shape. The side rails 402 and 502 originally attached to the lead frames 400 and 500 are separated from the assembly 300. In this invention, the backside 456 of the chip 450 and the backside 556 of the chip 550 are facing each other. Hence, there is no need to use adhesive tape to enlarge the separation between the two chips as a measure to prevent contact of their conductive wires or contact between conductive wire on a lower chip and the upper chip. In brief, the invention is capable of reducing package volume and the use of adhesive tape. With fewer adhesive tapes in the package to absorb and release moisture, delamination problem can be greatly reduced.

Figure 7:
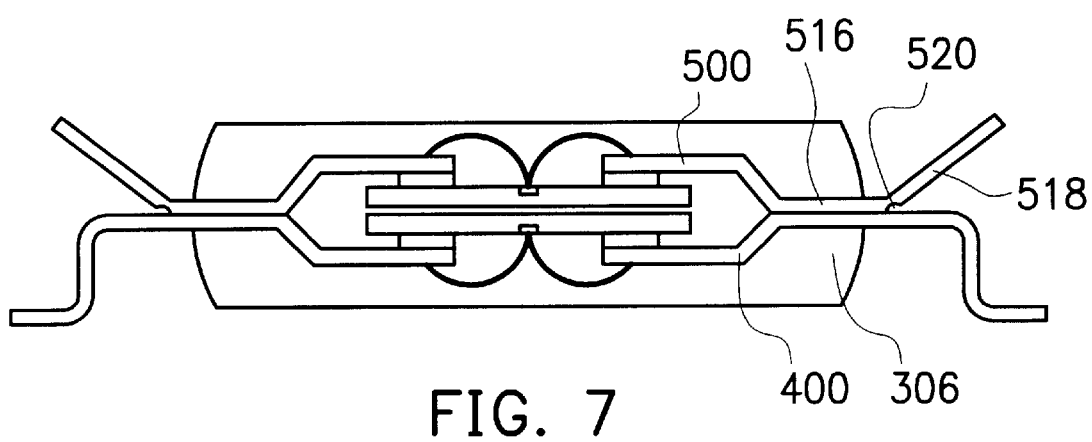
FIG. 7 is a schematic cross-sectional view showing a multi-chip semiconductor package structure according to a second preferred embodiment of this invention.

FIG. 7 is a schematic cross-sectional view showing a multi-chip semiconductor package structure according to a second preferred embodiment of this invention. In the first embodiment shown in FIG. 6, the joint sections 516 are located inside the packaging material 306. Hence, the joint sections 516 and the lead frame 400 can have very tight junctions. However, the joint sections 516 are not restricted to the aforementioned position. The joint sections 516 may extend into a region outside the packaging material 306 as shown in FIG. 7. The indentation 520 is now located outside the package body. Therefore, the step of removing the side bar 518 can be conducted before or after package molding.

Figure 8:
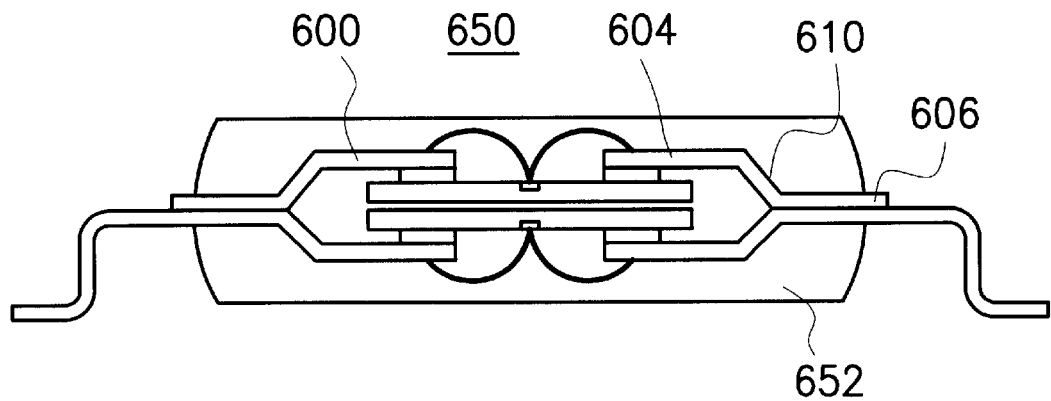
FIG. 8 is a schematic cross-sectional view showing a multi-chip semiconductor package structure according to a third preferred embodiment of this invention.
Figure 8A:
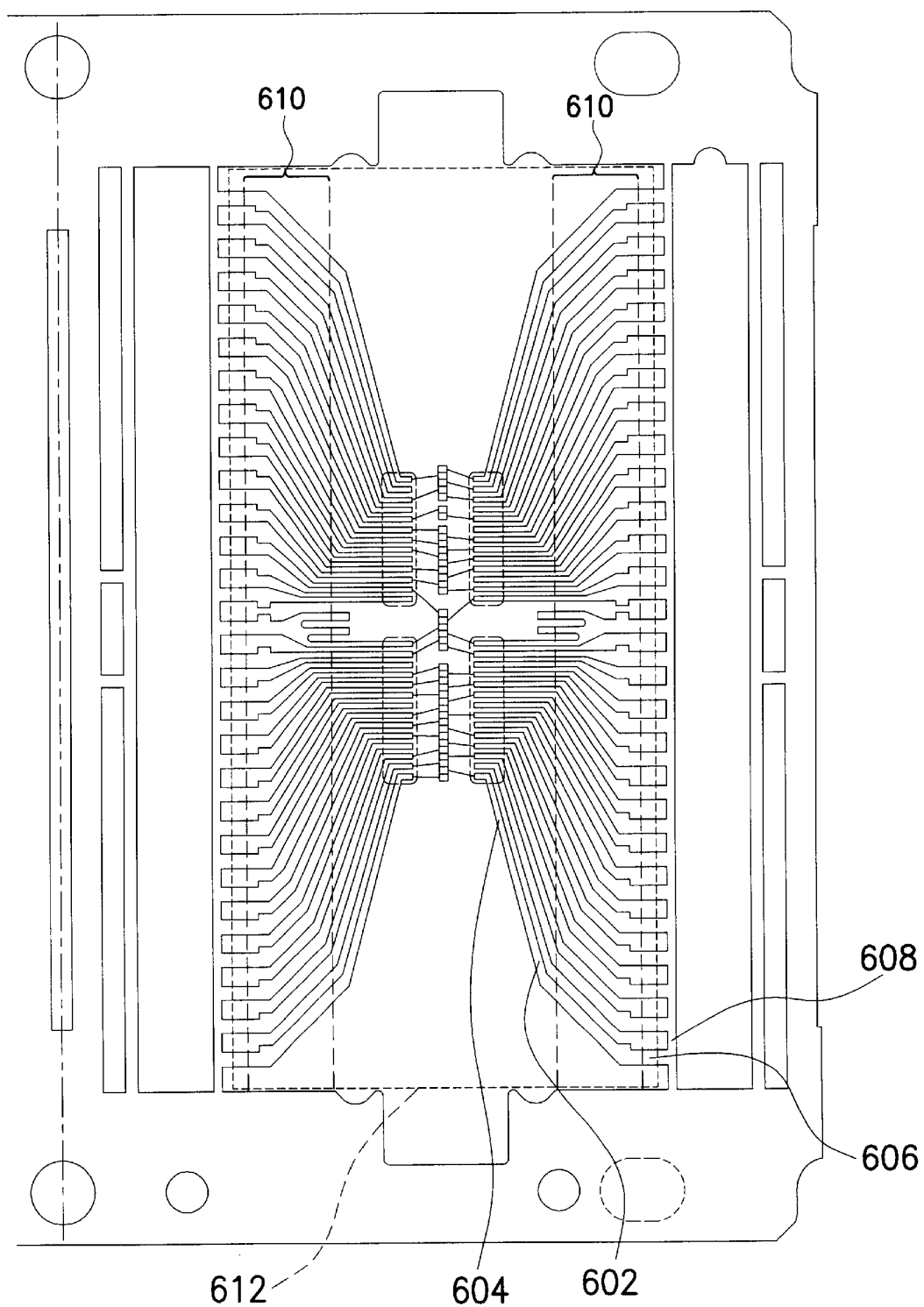
FIG. 8A is a bottom up view of the lead frame 600 shown in FIG. 8.

FIG. 8 is a schematic cross-sectional view showing a multi-chip semiconductor package structure according to a third preferred embodiment of this invention. FIG. 8A is a bottom up view of the lead frame 600 shown in FIG. 8. In the first embodiment, there is a side bar 518 just outside the joint sections 516 as shown in FIG. 3B. However, the side bar 518 is not restricted to such a position. A dam bar (not shown) may be used as a substitute for the side bar 518. As shown in FIG. 8A, the lead 602 has an inner lead 604 at one end and a joint section 606 at the other end. There is a dam bar 608 between every neighboring pair of leads 602. Each lead 602 has an indentation 610 located outside the edge of the inner lead 604. The area enclosed by the dash line 612 is the region ultimately sealed by packaging material. The joint section 606 is outside the packaging material 652. The dam bar 608 is separated from the leads 602 by cutting after the package 650 is formed.

Figure 9:
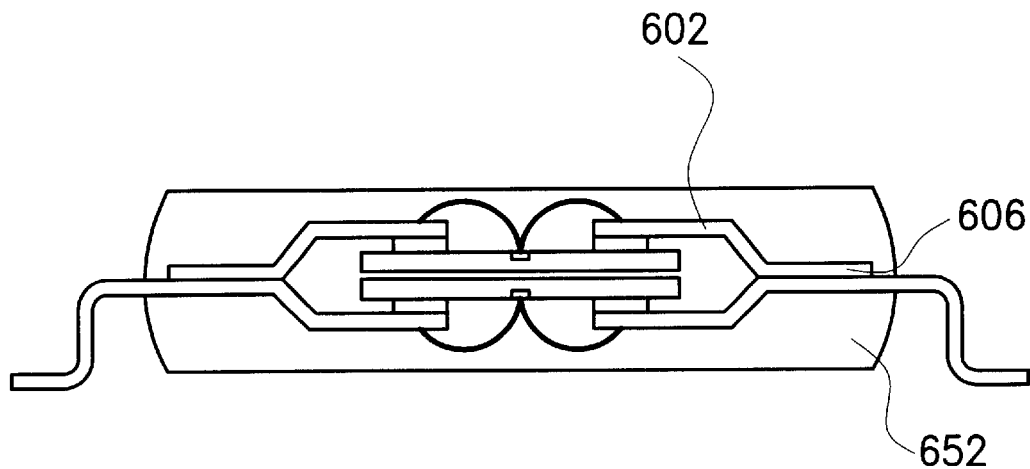
FIG. 9 is a schematic cross-sectional view showing a multi-chip semiconductor package structure according to a fourth preferred embodiment of this invention.

FIG. 9 is a schematic cross-sectional view showing a multi-chip semiconductor package structure according to a fourth preferred embodiment of this invention. In the third embodiment, the joint sections 606 are exposed outside the packaging material 632. However, the joint sections 606 are not restricted to such a location. The joint sections 606 can be enclosed inside the packaging material 652 as shown in FIG. 9. When the joint sections 606 are inside the package body, dam bar (not shown) and the leads 602 need to be separated before molding.

Figure 10:
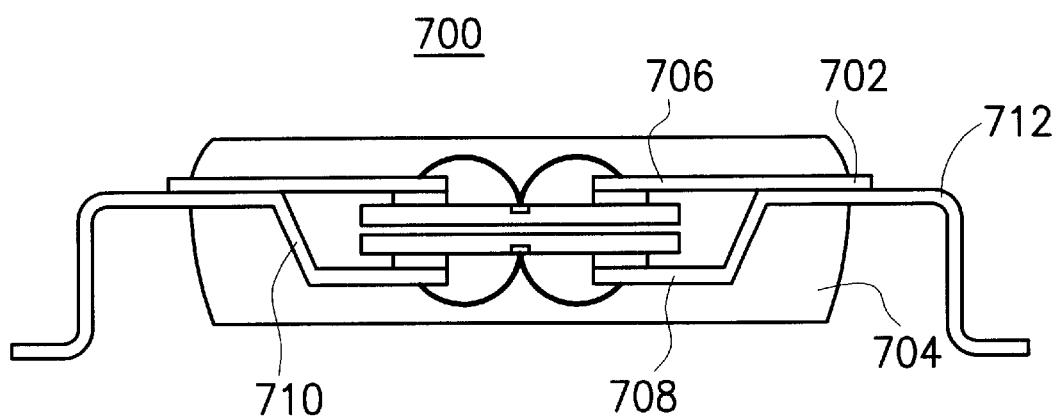
FIG. 10 is a schematic cross-sectional view showing a multi-chip semiconductor package structure according to a fifth preferred embodiment of this invention.
Figure 11:
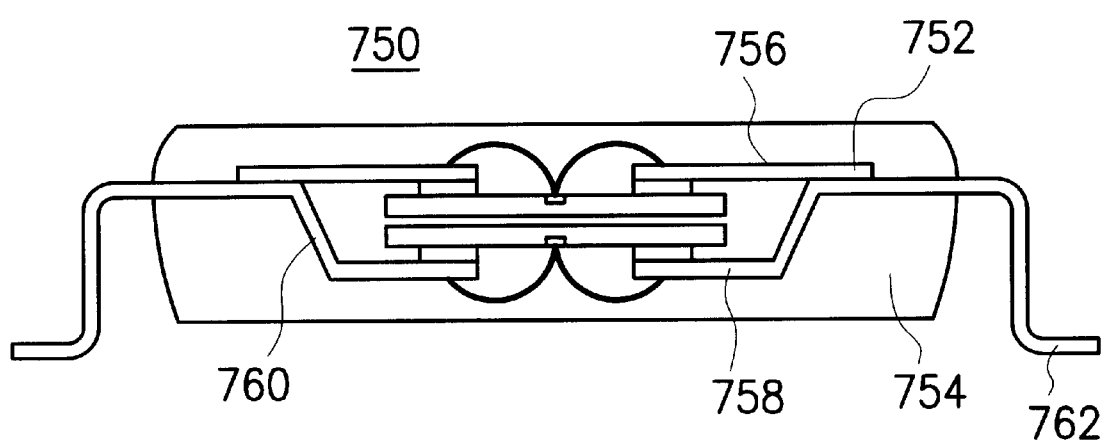
FIG. 11 is a schematic cross-sectional view showing a multi-chip semiconductor package structure according to a sixth preferred embodiment of this invention.

FIG. 10 is a schematic cross-sectional view showing a multi-chip semiconductor package structure according to a fifth preferred embodiment of this invention. FIG. 11 is a schematic cross-sectional view showing a multi-chip semiconductor package structure according to a sixth preferred embodiment of this invention. To prevent conductive wires 460 and 560 from exposing outside the packaging material 306 in the first embodiment (shown in FIG. 6), degree of bending for the leads 410 and 510 must be adjusted. Hence, both the leads 410 and the leads 510 have a bending region 420 and 522. However, this is not the only structural arrangement. The structural forms shown in FIGS. 10 and 11 are some of the alternatives LOC package designs. Only one set of leads is bent to prevent the conductive wires from exposing. In FIG. 10, a portion of the joint sections 702 is exposed outside the packaging material 704 and the lead frame 706 has no bending region. The lead frame 708 has a bending region 710 so that the outer leads 712 emerge from the upper portion of the package 700. In FIG. 11, the joint sections 752 are enclosed by the packaging material 754. The lead frame 756 has no bending region. The lead frame 758 has a bending region 760 so that external leads 762 emerges from the upper portion of the package 750. Through careful design of the bending region, the multi-chip semiconductor package of this invention can prevent the exposure of conductive wires outside the package.

The multi-chip semiconductor package design of this invention can be used to accommodate two chips inside a package originally intended for housing just one chip. Hence, there is no need to redesign molds. Volume of the package is greatly reduced through attaching the chips back-to-back. The bending of the upper leads and lower leads inside the package can prevent the exposure of conductive wires outside the package.

Figure 12A:
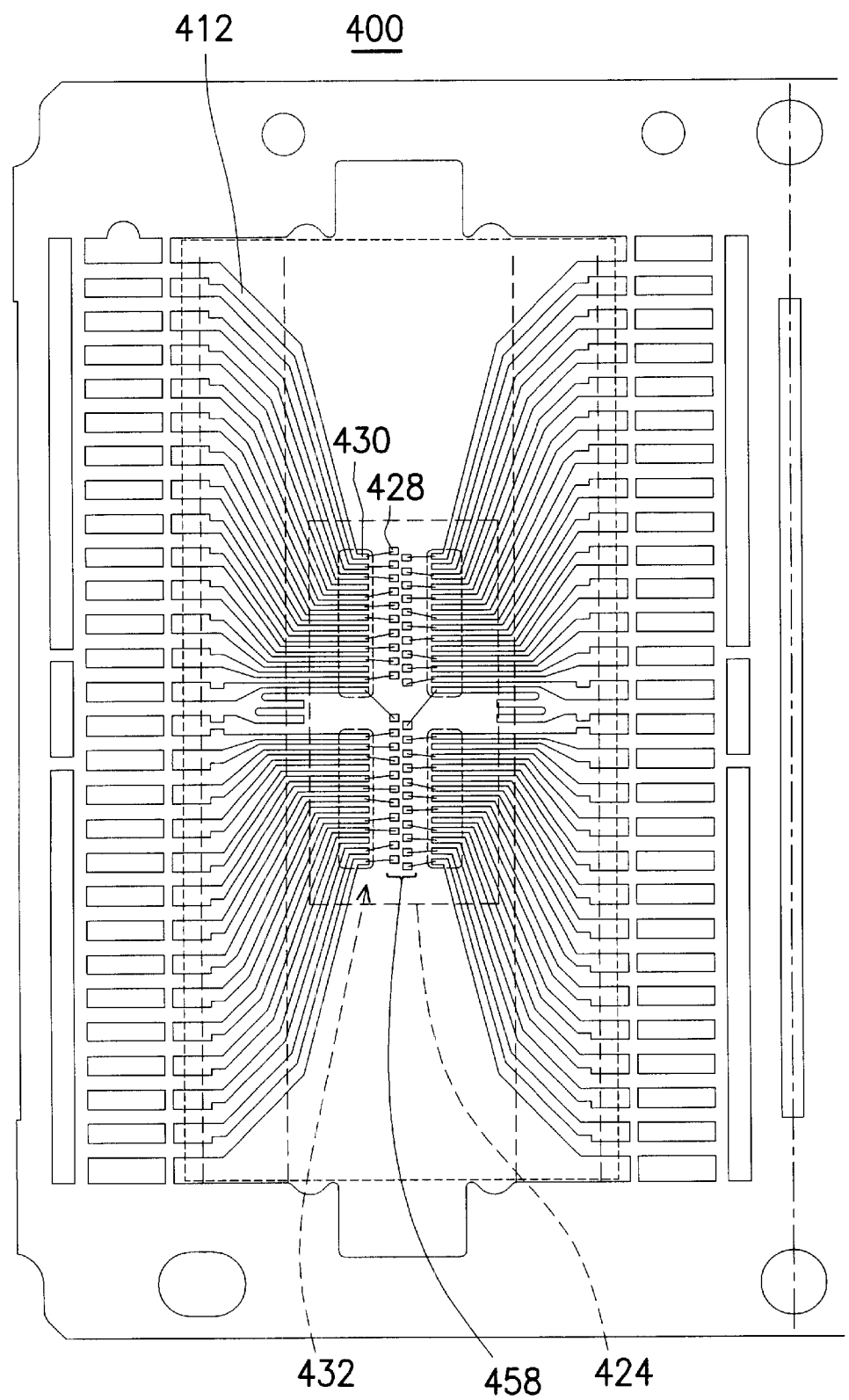
FIG. 12A is a bottom up view of a multi-chip semiconductor package structure corresponding to FIG. 3A and. according to a seventh preferred embodiment of this invention.
Figure 12B:
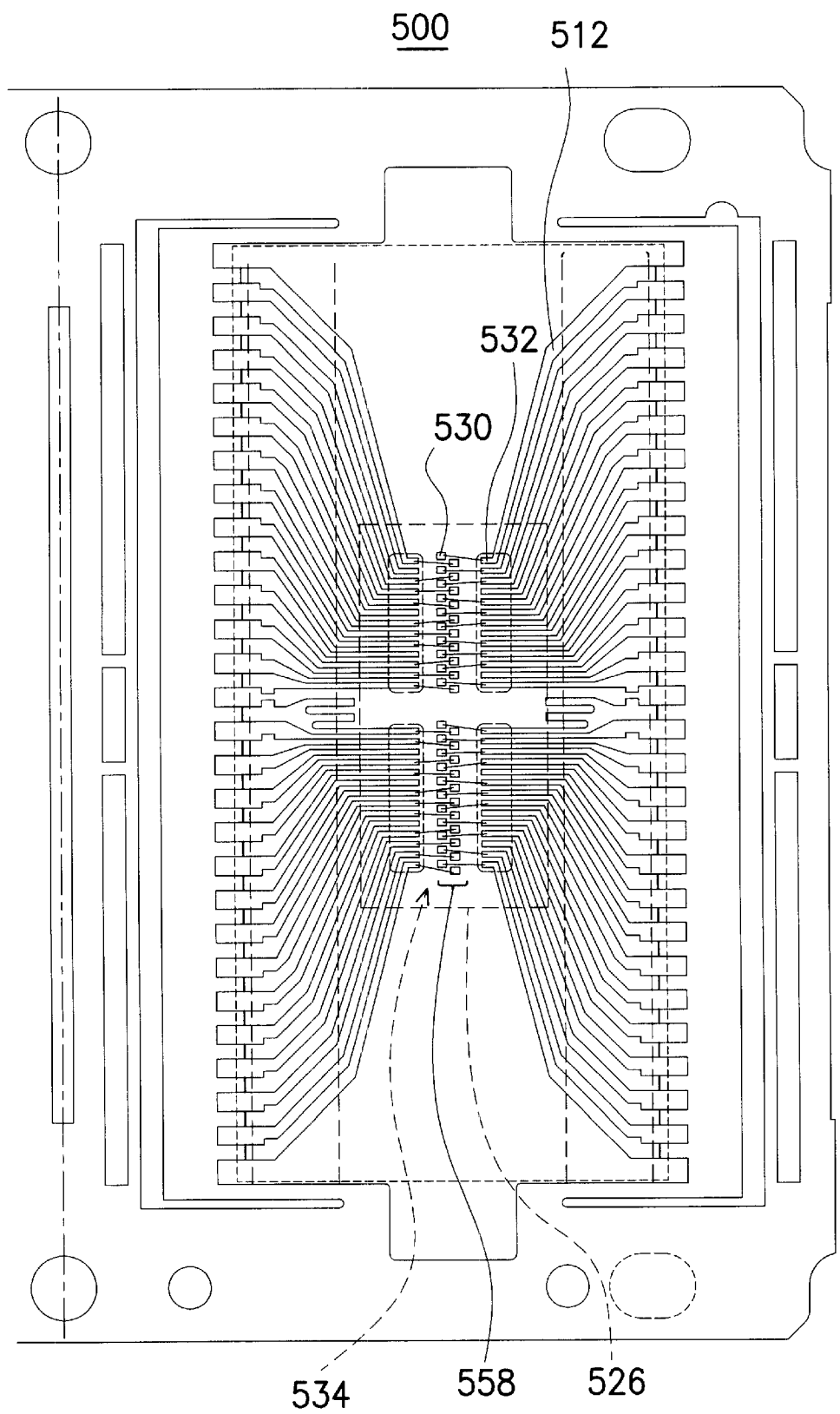
FIG. 12B is a top down view of a multi-chip semiconductor package structure corresponding to FIG. 3B and: according to a seventh preferred embodiment of this invention.

Referring to FIG. 12A, which illustrates a bottom up view of a multi-chip semiconductor package structure corresponding to FIG. 3A and according to a seventh preferred embodiment of this invention. Also, referring to FIG. 12B which illustrates a top down view of a multi-chip semiconductor package structure corresponding to FIG. 3B and according to a seventh preferred embodiment of this invention. In the first embodiment, the bonding pads are arranged in a single row at the middle of the active surface of the chip. Yet, the arrangement of the bonding pads is not limited to such arrangement. The bonding pads 458/558 can also alternating with each other in the middle of the active surfaces 432/534 of the chip 424/526, wherein one of the bonding pads 458/558 can be patterned to form a first bonding pad 428/530. However, the present embodiment shows a similar wire bonding method as described in the first embodiment. For instance, if a conductive wire rise from the first bonding pad 428 on the active surface 432 of the chip 424 to the tip 430 of the first lead 412 on the left of the lead frame 400, then a similar piece of conductive wire will rise from the first bonding pad 530 on the active surface 534 of the chip 526 to the tip 532 of the first lead 512 on the right of the lead frame 500.

Figure 13:
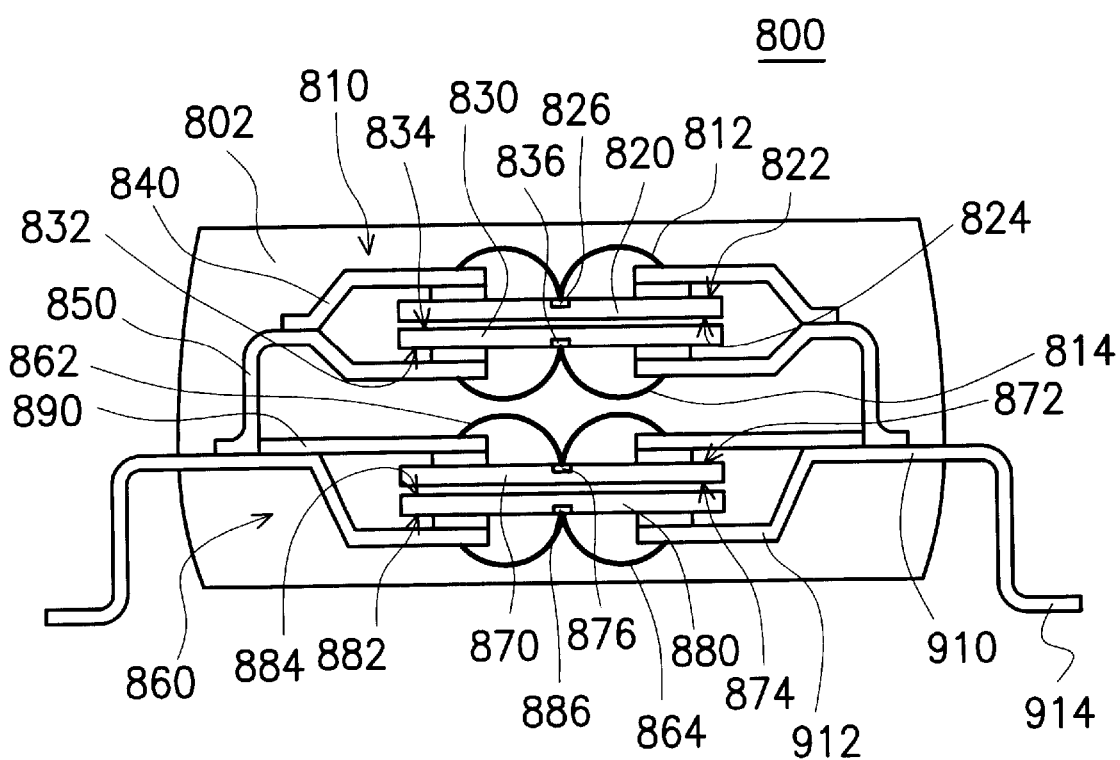
FIG. 13 is a schematic cross-sectional view showing a multi-chip semiconductor package structure according to a eighth preferred embodiment of this invention.

Referring to FIG. 13, which is a schematic cross-sectional view showing a multi-chip semiconductor package structure according to a eighth preferred embodiment of this invention. As described in the previous embodiments, each package is composed of two chips and two lead frames. However, the package of the present invention is not limited to the application mentioned above. The package 800 can have several lead modules 810, 860 (two modules are shown as an example in the present embodiment), being defined as a first lead module 810 and a second lead module 860, respectively. In the first lead module 810, there are a first plurality of leads 840 and a second plurality of leads 850 and two chips 820, 830, wherein the chips 820, 830 have active surfaces 822, 832 and corresponding backsides 824, 834, respectively. On the active surfaces 822, 832 of the chips 820, 830, there are bonding pads 826, 836 through which adhering the first and second plurality of leads 840, 850 respectively to the active surfaces 822, 832, while the backsides 824, 834 face each other. The bonding pads 826, 836 are connected electrically to the first and second plurality of leads 840, 850 through several conductive wires 812, 814. Also, the first plurality of leads 840 connect to one end of the second plurality of leads 850, while the other end of the second plurality of leads 850 connect to other leads in the second lead frame module 860.

In the second lead frame module 860, there are a third plurality of leads 890, a fourth plurality of leads 910 and two chips 870, 880, wherein the chips 870, 880 have active surfaces 872, 882 and corresponding backsides 874, 884, respectively. On the active surfaces 872, 882 of the chips 870, 880, there are bonding pads 876, 886 through which adhering the third and fourth plurality of leads 890, 910 respectively to the active surfaces 872, 882, while the backsides 874, 884 face each other. The bonding pads 876, 886 are connected electrically to the third and fourth plurality of leads 890, 910 through several conductive wires 862, 864. Further, the fourth plurality of leads 910 includes inner leads 912 and outer leads 914. The second lead frame module is connected to the first lead frame module by making an electrical connection between the second plurality of leads 850 to the third and fourth plurality of leads 890, 910 as shown in FIG. 13. In addition, the package 800 also includes a packaging material 802 which encompass the chips 820, 830, 870, 880, and the plurality of leads 840, 850, 890, 910, while the outer leads 914 can be exposed to connect electrically to the outer circuit (not shown).

The multi-chip semiconductor package structure according to the invention can be applied to a DRAM package to double the memory capacity by adding one more chip. In here, a package with two 16M×4(128M) chips and a package with two 8M×8(128M) chips are chosen as examples.

Figure 14:
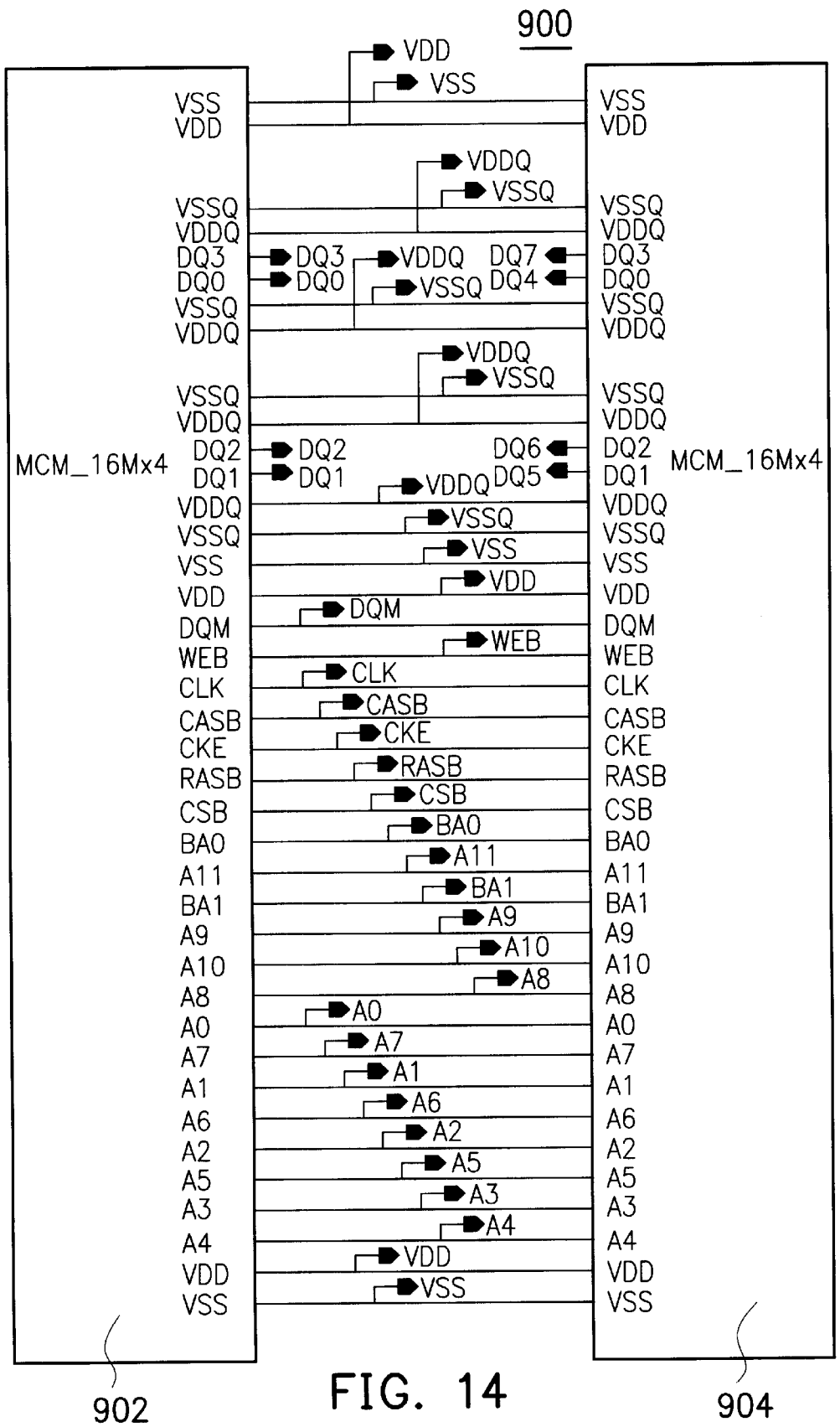
FIG. 14 is a schematic diagram showing the signal leads of two 16M×4(128M) chips.

FIG. 14 is a schematic diagram showing the signal leads of two 16M×4(128M) chips. As shown in FIG. 14, leads A0 to A11 are used to indicate the address of special memory units. Leads DQ0 to DQ3 are used as indicator for signaling data input and output. Since most data system uses 8 bits or a byte as a unit in transmission, the DRAM package must have 8 memory banks to hold each of the 8 bits of data. The two 16M×4(128M) chips inside the package 900 has two memory chips 902 and 904 with each chip having four memory banks. The memory banks employ leads DQ0 to DQ3 to transmit signals related to these four memory banks. Hence, two memory chips together provide 8 banks. In other words, 8 bits of data can be access at any one time when each memory bank holds a single bit.

Figure 15:
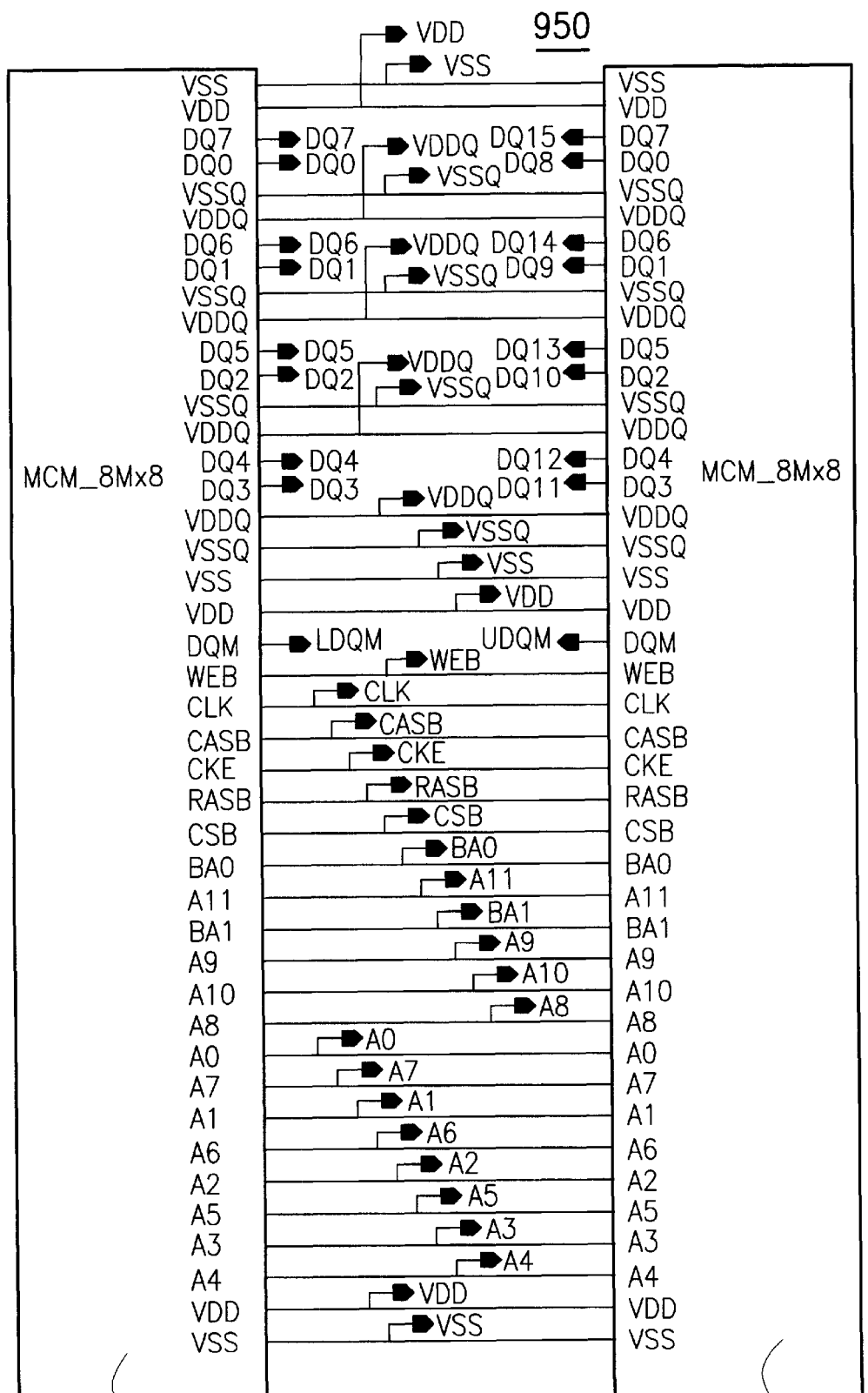
FIG. 15 is a schematic diagram showing the signal leads of two 8M×8(128M) chips.

FIG. 15 is a schematic diagram showing the signal leads of two 8M×8(128M) chips. As shown in FIG. 15, leads A0 to A11 are used to indicate the address of special memory units. Leads DQ0 to DQ7 are used as indicator for signaling data input and output. Lead DQM is a chip control signal. When the DQM lead receives a LDQM signal, the lower chip is activated. On the other hand, if the DQM lead receives a UDQM signal, the upper chip is activated. The two 8M×8(128M) chips inside the package 950 has two memory chips 952 and 954 with each chip having eight memory banks. The memory banks employ leads DQ0 to DQ7 to transmit signals related to these eight memory banks. Hence, two memory chips together provide 16 banks. However, each data transmission can transfer at most 8 bits under the control of the LDQM or the UDQM signal. In other words, data are transmitted to the 8 memory banks in the upper chip or the 8 memory banks in the lower chip according to whether LDQM or UDQM signal is issued.

In summary, the advantages of the multi-chip semiconductor package in this invention includes:

1. The upper chip and the lower chip of the package are facing each other back-to-back. Neither the conductor wires of the upper chip will contact the conductive wires of the lower chip nor will the conductor wire of the lower chip contact the upper chip. Hence, yield of the chip package will increase.

2. Since the two chips inside the package are facing each other back-to-back, overall volume of the package can be reduced. Therefore, two chips can now be enclosed within a mold that used to accommodate only a single chip. In other words, the number of chip inside a package is doubled without having to change the mold.

3. Delamination of package arising from moisture absorption will improve because fewer adhesive tapes are used.

4. An indentation is formed at the junction between the side bar and the joint section by half-etching or punching. Hence, the side bar can be readily removed.

5. The package can be applied to DRAM design for doubling the storage capacity of a package.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a multi-chip semiconductor package, comprising the steps of:

providing a first lead frame having a plurality of first leads, wherein each first lead has an inner lead at one end and an outer lead at the other end;

providing a second lead frame having a plurality of second leads, wherein the second leads have an inner lead at one end and a joint section at the other end;

providing a first chip having a first active surface and a first backside, wherein the first active surface of the first chip has a plurality of first bonding pads;

providing a second chip having a second active surface and a second backside, wherein the second active surface of the second chip has a plurality of second bonding pads, and the first backside of the first chip is facing the second backside of the second chip;

performing a first chip attachment operation such that the first active surface of the first chip is attached to the first lead frame and the second active surface of the second chip is attached to the second lead frame;

performing a wire-bonding operation such that the first bonding pads on the first active surface of the first chip are electrically connected to the first inner leads by a plurality of conductive wires and the second bonding pads on the second active surface of the second chip are electrically connected to the second inner leads by a plurality of conductive wires;

aligning the first leads and the joint sections and electrically connecting the first leads and the joint sections; and performing a molding operation by injecting packaging material into a mold having a cavity that encloses the first inner leads, the second inner leads, the first chip and the second chip while exposing the outer leads.

2. The method of claim 1, wherein the outer edges of the joint sections further includes a side bar.

3. The method of claim 2, wherein an indentation is formed at the junction between a joint section and the side bar by half-etching.

4. The method of claim 2, wherein an indentation is formed at the junction between a joint section and the side bar by half-cutting with a punching machine.

5. The method of claim 2, wherein before the step of performing the molding operation, further includes removing the side bar.

6. The method of claim 5, wherein the joint sections are enclosed within the package body.

7. The method of claim 5, wherein the joint sections are exposed outside the package body.

8. The method of claim 2, further includes removing the side bars after the molding, so that the joint sections are exposed outside the package body.

9. The method of claim 1, wherein the outer edges of the first inner leads and the second inner leads have a bending region, and before attaching the chips, further includes bending the first leads and the second leads somewhere inside the bending region.

10. The method of claim 1, wherein the outer edges of the first inner leads have a bending region, and before attaching the chips, further includes bending the first leads somewhere inside the bending region.

11. The method of claim 1, wherein the outer edges of the second inner leads have a bending region, and before attaching the chips, further includes bending the second leads somewhere inside the bending region.

12. The method of claim 1, wherein the first bonding pads on the first active surface of the first chip are aligned in a single row arrangement or staggered arrangement.

13. The method of claim 1, wherein the second bonding pads on the second active surface of the second chip are aligned in a single row arrangement or staggered arrangement, while a common axis for the bonding pads on the first chip and the second chip is defined as a Y axis, so that the wire-bondings on the first chip and the second chip shows a mirror symmetry relationship along the Y axis.

14. The method of claim 1, further includes printing a layer of conductive glue on the joint sections before the step of attaching the chips.

15. The method of claim 14, wherein the conductive glue includes solder paste.

16. The method of claim 14, wherein the step of connecting the first leads and the joint sections electrically includes performing a reflow operation.

17. The method of claim 14, wherein the step of connecting the first leads and the joint sections electrically includes a gluing operation.

18. The method of claim 1, further includes a cutting operation after package molding.

19. The method of claim 1, further includes a lead forming operation after the package molding.

* * * * *